(12) United States Patent
Reed et al.

(10) Patent No.: US 9,246,078 B2
(45) Date of Patent: Jan. 26, 2016

(54) PIEZOELECTRIC APPARATUSES, SYSTEMS AND METHODS THEREFOR

(71) Applicant: The Board of Trustees of the Leland Stanford Junior University, Palo Alto, CA (US)

(72) Inventors: Evan J. Reed, Sunnyvale, CA (US); Mitchell T. Ong, Buena Park, CA (US); Karel-Alexander Niklaas Duerloo, Mortsel (BE); Yao Li, Jiagsu (CN)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 403 days.

(21) Appl. No.: 13/775,640

(22) Filed: Feb. 25, 2013

(65) Prior Publication Data

US 2014/0062255 A1    Mar. 6, 2014

Related U.S. Application Data

(60) Provisional application No. 61/605,656, filed on Mar. 1, 2012.

(51) Int. Cl.
| | |
|---|---|
| *H01L 41/09* | (2006.01) |
| *H01L 41/08* | (2006.01) |
| *H01L 41/25* | (2013.01) |
| *H01L 41/113* | (2006.01) |
| *H01L 41/18* | (2006.01) |
| *H01L 41/35* | (2013.01) |
| *B82B 1/00* | (2006.01) |

(52) U.S. Cl.
CPC .............. *H01L 41/08* (2013.01); *H01L 41/094* (2013.01); *H01L 41/1132* (2013.01); *H01L 41/1136* (2013.01); *H01L 41/18* (2013.01); *H01L 41/25* (2013.01); *H01L 41/35* (2013.01); *B82B 1/008* (2013.01); *Y10T 29/42* (2013.01)

(58) Field of Classification Search
CPC .... H01B 17/28; H01L 29/7606; H01L 27/00; H01L 31/101; H01G 2/12; C23C 16/26; B92Y 30/00; B82Y 10/00; B82Y 20/00
USPC .................. 257/29; 361/301.01; 428/408
See application file for complete search history.

(56) References Cited

U.S. PATENT DOCUMENTS

| 8,416,406 B2* | 4/2013 | Stuke et al. .................... 356/301 |
|---|---|---|
| 2011/0129675 A1* | 6/2011 | Choi et al. ..................... 428/408 |
| 2012/0133247 A1* | 5/2012 | Lee et al. ....................... 310/339 |

(Continued)

OTHER PUBLICATIONS

Bechmann, R., "Elastic and Piezoelectric Constants of Alpha-Quartz." Phys. Rev., 110, pp. 1060-1061, (1958).

(Continued)

*Primary Examiner* — Thomas Dougherty
(74) *Attorney, Agent, or Firm* — Crawford Maunu PLLC

(57) ABSTRACT

Various aspects as described herein are directed to piezoelectric materials. As consistent with one or more embodiments, an apparatus includes a nanomaterial and structures coupled to the nanomaterial. This nanomaterial-structure combination manifests piezoelectric characteristics, via the combination. In certain implementations, neither the nanomaterial nor the coupled structures independently exhibit piezoelectric characteristics, yet do so in combination.

20 Claims, 8 Drawing Sheets

(56) References Cited

U.S. PATENT DOCUMENTS

2012/0305891 A1* 12/2012 Nayfeh et al. .................. 257/26
2014/0346442 A1* 11/2014 Nag et al. ........................ 257/29

OTHER PUBLICATIONS

Jaffe, H. and Berlincourt, D. A., "Piezoelectric Transducer Materials." Proc. IEEE, 53, pp. 1372-1386, (1965).
Wilson, J. A. and Yoffe, A. D., "Transition Metal Dichalcogenides Discussion and Interpretation of Observed Optical, Electrical and Structural Properties." Adv. Phys., 18, pp. 193-335, (1969).
Blakslee, O. L.; Proctor, D. G.; Seldin, E. J.; Spence, G. B. and Weng, T., "Elastic Constants of Compression-Annealed Pyrolytic Graphite." J. Appl. Phys., 41, pp. 3373-3382, (1970).
Feldman, J. L., "Elastic-Constants of 2H-MoS2 and 2H-NbSe2 Extracted from Measured Dispersion Curves and Linear Compressibilities." J. Phys. Chem. Solids, 37, pp. 1141-1144, (1976).
Monkhorst, H. J. and Pack, J. D., "Special Points for Brillouin-Zone Integrations." Phys. Rev. B, 13, pp. 5188-5192, (1976).
Bachelet, G. B. and Schluter, M., "Relativistic Norm-conserving Pseudopotentials." Phys. Rev. B, 25, pp. 2103-2108, (1982).
Hu, Z. P. and Ignatiev, A., "Lithium Adsorption on the Graphite (0001) Surface." Phys. Rev. B, 30, pp. 4856-4859, (1984).
Joensen, P.; Frindt, R. F. and Morrison, S. R., "Single-Layer MoS2." Mater. Res. Bull., 21, pp. 457-461, (1986).
Yang, D.; Sandoval, S.; Divigalpitiya, W.; Irwin, J. and Frindt, R., "Structure of Single-Molecular-Layer MoS2." Phys. Rev. B, 43, pp. 12053-12056, (1991).
Morten, B.; Decicco, G. and Prudenziati, M., "Resonant Pressure Sensor Based on Piezoelectric Properties of Ferroelectric Thick-Films." Sens. Actuator A-Phys., 31, pp. 153-158, (1992).
Bykhovski, A.; Gelmont, B. and Shur, M., "The Influence of the Strain-Induced Electric Field on the Charge Distribution in GaN—AINGaN Structure." J. Appl. Phys., 74, 6734, (1993).
Yang, D. and Frindt, R. F., "Li-Intercalation and Exfoliation of WS2." J. Phys. Chem. Solids, 57, pp. 1113-1116, (1996).
Bengtsson, L., "Dipole Correction for Surface Supercell Calculations." Phys. Rev. B, 59, pp. 12301-12304, (1999).
Osterlund, L.; Chakarov, D. V. and Kasemo, B., "Potassium Adsorption on Graphite(0001)." Surf. Sci., 420, pp. 174-189, (1999).
Gordon, R. A.; Yang, D.; Crozier, E. D.; Jiang, D. T. and Frindt, R. F., "Structures of Exfoliated Single Layers of WS2, MoS2, and MoSe2 in Aqueous Suspension." Phys. Rev. B, 65, pp. 1254071-1254079, (2002).
Hangleiter, A.; Hitzel, F.; Lahmann, S. and Rossow, U., "Composition Dependence of Polarization Fields in GaInN/GaN Quantum Wells." Appl. Phys. Lett., 83, pp. 1169-1171, (2003).
Sai, N. and Mele, E. J., "Microscopic Theory for Nanotube Piezoelectricity." Phys. Rev. B, 68, 241405, (2003).
Caragiu, M. and Finberg, S. "Alkali Metal Adsorption on Graphite: A Review." J. Phys.-Condens. Matter, 17, R995-R1024, (2005).
Grow, R. J.; Wang, Q.; Cao, J.; Wang, D. W. and Dai, H. J., "Piezoresistance of Carbon Nanotubes on Deformable Thin-Film Membranes." Appl. Phys. Lett., 86, 093104, (2005).
Nishio, M.; Sawaya, S.; Akita, S. and Nakayama, Y., "Carbon Nanotube Oscillators Toward Zeptogram Detection." Appl. Phys. Lett., 86, 133111, (2005).
Bosak, A.; Serrano, J.; Krisch, M.; Watanabe, K.; Taniguchi, T. and Kanda, H., "Elasticity of Hexagonal Boron Nitride: Inelastic X-ray Scattering Measurements." Phys. Rev. B, 73, 041402, (2006).
Kaul, A. B.; Wong, E. W.; Epp, L. and Hunt, B. D., "Electromechanical Carbon Nanotube Switches for High-Frequency Applications." Nano Lett., 6, pp. 942-947, (2006).
Shimada, K., "First-Principles Determination of Piezoelectric Stress and Strain Constants of Wurtzite III-V Nitrides." Jpn. J. Appl. Phys., 45, L358-L360, (2006).
Stampfer, C.; Helbling, T.; Obergfell, D.; Schoberle, B.; Tripp, M. K.; Jungen, A.; Roth, S.; Bright, V. M. and Hierold, C., "Fabrication of Single-Walled Carbon-Nanotube-Based Pressure Sensors." Nano Lett., 6, pp. 233-237, (2006).

Stampfer, C.; Jungen, A.; Linderman, R.; Obergfell, D.; Roth, S. and Hierold, C., "Nano-electromechanical Displacement Sensing Based on Single-Walled Carbon Nanotubes." Nano Lett., 6, pp. 1449-1453, (2006).
Lugo-Solis, A. and Vasiliev, I., "Ab Initio Study of K Adsorption on Graphene and Carbon Nanotubes: Role of Long-Range Ionic Forces." Phys. Rev. B, 76, 235431, (2007).
Resta, R. and Vanderbilt, D., "Theory of Polarization: A Modern Approach." Springer-Verlag: Berlin, (2007).
Arsat, R.; Breedon, M.; Shafiei, M.; Spizziri, P. G.; Gilje, S.; Kaner, R. B.; Kalantar-Zadeh, K. and Wlodarski, W., "Graphene-like Nanosheets for Surface Acoustic Wave Gas Sensor Applications." Chem. Phys. Lett., 467, pp. 344-347, (2009).
Bao, W. Z.; Miao, F.; Chen, Z.; Zhang, H.; Jang, W. Y.; Dames, C. and Lau, C. N. "Controlled Ripple Texturing of Suspended Graphene and Ultrathin Graphite Membranes." Nat. Nanotechnol., 4, pp. 562-566, (2009).
Michel, K.H. and Verberck, B., "Theory of Elastic and Piezoelectric Effects in Two-Dimensional Hexagonal Boron Nitride." Phys. Rev. B, 80,224301, (2009).
Naumov, I.; Bratkovsky, A. M. and Ranjan, V., "Unusual Flexoelectric Effect in Two-Dimensional Noncentrosymmetric sp(2)-Bonded Crystals." Phys. Rev. Lett., 102,217601, (2009).
Sessi, P.; Guest, J. R.; Bode, M. and Guisinger, N. P., "Patterning Graphene at the Nanometer Scale via Hydrogen Desorption." Nano Lett., 9, pp. 4343-4347, (2009).
Hossain, M. Z., "Quantum Conductance Modulation in Graphene by Strain Engineering." Appl. Phys. Lett., 96, 143118, (2010).
Jin, K. H.; Choi, S. M. and Jhi, S. H., "Crossover in the Adsorption Properties of Alkali Metals on Graphene." Phys. Rev. B, 82, 033414, (2010).
Medeiros, P. V. C.; Mascarenhas, A. J. S.; Mota, F. D. and de Castilho, C. M. C., "A DFT Study of Halogen Atoms Adsorbed on Graphene Layers." Nanotechnology, 21 (48), (2010).
Li, B.; Zhou L.; Wu, D.; Peng, H. L.; Yan, K.; Zhou, Y. and Liu, Z. F., "Photochemical Chlorination of Graphene." ACS Nano, 5 (7), pp. 5957-5961, (2011).
Michel, K. H. and Verberck, B., "Phonon Dispersions and Piezoelectricity in Bulk and Multilayers of Hexagonal Boron Nitride." Phys. Rev. B, 83, 115328, (2011).
Proie, R. M.; Polcawich, R. G.; Pulskamp, J. S.; Ivanov, T. and Zaghloul, M. E., "Development of a PZT MEMS Switch Architecture for Low-Power Digital Applications." J. MEMS, 20, pp. 1032-1042, (2011).
Radisavljevic, B.; Radenovic, A.; Brivio, J.; Giacometti, V. and Kis, A., "Single-Layer MoS2 Transistors." Nat. Nanotechnol., 6, pp. 147-150, (2011).
Duerloo, K. N.; Ong, M. T. and Reed, E. J., "Intrinsic Piezoelectricity in Two-Dimensional Materials." Journal of Physical Chemistry Letters, 3 (19), pp. 2871-2876, (2012).
Ong, M. T. and Reed, E. J., "Engineered Piezoelectricity in Graphene." ACS Nano, 6 (2), pp. 1387-1394, (2012).
Ong, M. T.; Duerloo, K.-A. N. and Reed, E. J., "The Effect of Hydrogen and Fluorine Coadsorption on the Piezoelectric Properties of Graphene," J. Phys. Chem, 117, pp. 3615-3620, (2013).
Bacon, G. E., "The Interlayer Spacing of Graphite." Acta Crystallogr. 4, pp. 558-561, (1951).
Pease, R. S., "An X-Ray Study of Boron Nitride." Acta Crystallogr. 5, pp. 356-361, (1952).
Brown, B. E., "The Crystal Structures of WTe2 and High-Temperature MoTe2." Acta Crystallogr., 20, pp. 268-274, (1966).
Kunc, K. and Resta, R., "External Fields in the Self-Consistent Theory of Electronic States: A New Method for Direct Evaluation of Macroscopic and Microscopic Dielectric Response." Phys. Rev. Lett. 51, pp. 686-689, (1983).
Vanderbilt, D., "Soft Self-Consistent Pseudopotentials in a Generalized Eigenvalue Formalism." Phys. Rev. B, 41, pp. 7892-7895, (1990).
Troullier, N. and Martins, J. L., "Efficient Pseudopotentials for Plane-Wave Calculations." Phys. Rev. B, 43, pp. 1993-2006, (1991).
King-Smith, R. D. and Vanderbilt, D., "Theory of Polarization of Crystalline Solids." Phys. Rev. B 47 (3), pp. 1651-1654, (1993).

(56) References Cited

OTHER PUBLICATIONS

Blochl, P. E., "Projector Augmented-Wave Method." Phys. Rev. B, 50, pp. 17953-17979, (1994).
Perdew, J. P.; Burke, K. and Ernzerhof, M., "Generalized Gradient Approximation Made Simple". Phys. Rev. Lett., 77, pp. 3865-3868, (1996).
Tans, S. J.; Verschueren, A. R. M. and Dekker, C., "Room-Temperature Transistor Based on a Single Carbon Nanotube". Nature, (393), pp. 49-52, (1998).
Guy, I. L.; Muensit, S. and Goldys, E. M., "Extensional Piezoelectric Coefficients of Gallium Nitride and Aluminum Nitride". Appl. Phys. Lett., vol. 75, pp. 4133-4135, (1999).
Bennich, P.; Puglia, C.; Bruhwiler, P. A.; Nilsson, A.; Maxwell, A. J.; Sandell, A.; Martensson, N. and Rudolf, P., "Photoemission Study of K on Graphite." Phys. Rev. B, vol. 59, pp. 8292-8304, (1999).
Kim, P. and Lieber, C. M., "Nanotube Nanotweezers." Science, vol. 286, pp. 2148-2150, (1999).
Craighead, H. G., "Nanoelectromechanical Systems." Science, vol. 290, pp. 1532-1535, (2000).
Lueng, C. M.; Chan, H. L. W.; Surya, C. and Choy, C. L., "Piezoelectric Coefficient of Aluminum Nitride and Gallium Nitride." J. Appl. Phys., vol. 88, No. 9, (2000).
Fennimore, A. M.; Yuzvinsky, T. D.; Han, W. Q.; Fuhrer, M. S.; Cumings, J. and Zettl, A., "Rotational Actuators Based on Carbon Nanotubes." Nature, vol. 424, pp. 408-410, (2003).
Requicha, A. A. G., "Nanorobots, NEMS, and Nanoassembly." Proc. IEEE, vol. 91, pp. 1922-1933, (2003).
Nakhmanson, S.; Calzolari, A.; Meunier, V.; Bernholc, J. and Buongiorno Nardelli, M., "Spontaneous Polarization and Piezoelectricity in Boron Nitride Nanotubes." Phys. Rev. B, 67,235406, (2003).
Novoselov, K. S.; Geim, A. K.; Morozov, S. V.; Jiang, D.; Zhang, Y.; Dubonos, S. V.; Grigorieva, I. V. and Firsov, A. A., "Electric Field Effect in Atomically Thin Carbon Films." Science, vol. 306, pp. 666-669, (2004).
Lee, S. W.; Lee, D. S.; Morjan, R. E.; Jhang, S. H.; Sveningsson, M.; Nerushev, O. A.; Park, Y. W. and Campbell, E. E. B., "A Three-Terminal Carbon Nanorelay". Nano Lett., vol. 4, pp. 2027-2030, (2004).
Novoselov, K. S.; Jiang, D.; Schedin, F.; Booth, T. J.; Khotkevich, V. V.; Morozov, S. V. and Geim, A. K., "Two-Dimensional Atomic Crystals." Proc. Natl. Acad. Sci. U.S.A., vol. 102, pp. 10451-10453, (2005).
van Delden, R. A.; ter Wiel, M. K. J.; Pollard, M. M.; Vicario, J.; Koumura, N. and Feringa, B. L., "Unidirectional Molecular Motor on a Gold Surface." Nature, vol. 437, pp. 1337-1340, (2005).
Shirai, Y.; Osgood, A. J.; Zhao, Y. M.; Kelly, K. F. and Tour, J. M., "Directional Control in Thermally Driven Single-Molecule Nanocars". Nano Lett., vol. 5, pp. 2330-2334, (2005).
Wang, Z. L. and Song, J. H., "Piezoelectric Nanogenerators Based on Zinc Oxide Nanowire Arrays." Science, vol. 312, pp. 242-246, (2006).
Ohta, T.; Bostwick, A.; Seyller, T.; Horn, K. and Rotenberg, E., "Controlling the Electronic Structure of Bilayer Graphene." Science, vol. 313, pp. 951-954, (2006).
Sofo, J. O.; Chaudhari, A. S. and Barber, G. D., "Graphane: A Two-Dimensional Hydrocarbon." Phys. Rev. B, 75, 153401, (2007).
Sharma, N.D.; Maranganti, R. and Sharma, P., "On the Possibility of Piezoelectric Nanocomposites without Using Piezoelectric Materials." J. Mech. Phys. Solids, 55, pp. 2328-2350, (2007).
Wang, Z. L., "Nanopiezotronics." Adv. Mater., 19, pp. 889-892, (2007).
Jensen, K.; Weldon, J.; Garcia, H. and Zettl, A., "Nanotube Radio." Nano Lett., vol. 7, pp. 3508-3511, (2007).
Fogler, M. M.; Guinea, F. and Katsnelson, M. I., "Pseudomagnetic Fields and Ballistic Transport in a Suspended Graphene Sheet." Phys. Rev. Lett., vol. 101, 226804, (2008).
Lee, C.; Wei, X. D.; Kysar, J. W. and Hone, J., "Measurement of the Elastic Properties and Intrinsic Strength of Monolayer Graphene." Science, 321, pp. 385-388, (2008).
Yu, T.; Ni, Z.; Du, C.; You, Y.; Wang, Y. and Shen, Z., "Raman Mapping Investigation of Graphene on Transparent Flexible Substrate: The Strain Effect." J. Phys. Chem. B, 112, pp. 12602-12605, (2008).
Ferralis, N.; Maboudian, R. and Carraro, C., "Evidence of Structural Strain in Epitaxial Graphene Layers on 6H-SiC (0001)." Phys. Rev. Lett., 101,156801, (2008).
Oostinga, J. B.; Heersche, H. B.; Liu, X. L.; Morpurgo, A. F. and Vandersypen, L. M. K., "Gate-Induced Insulating State in Bilayer Graphene Devices." Nat. Mater., 7, pp. 151-157, (2008).
Bunch, J. S.; Verbridge, S. S.; Alden, J. S.; van der Zande, A. M.; Parpia, J. M.; Craighead, H. G. and McEuen, P. L., "Impermeable Atomic Membranes from Graphene Sheets." Nano Lett., 8, pp. 2458-2462, (2008).
Chen, J. H.; Jang, C.; Adam, S.; Fuhrer, M. S.; Williams, E. D. and Ishigami, M., "Charged-Impurity Scattering in Graphene." Nat. Phys., 4, pp. 377-381, (2008).
Chan, K. T.; Neaton, J. B. and Cohen, M. L., "First-Principles Study of Metal Adatom Adsorption on Graphene." Phys. Rev. B, 77,235430, (2008).
Chen, J. H.; Jang, C.; Xiao, S. D.; Ishigami, M. and Fuhrer, M. S., "Intrinsic and Extrinsic Performance Limits of Graphene Devices on SiO2" Nat. Nanotechnol., 3 (4), pp. 206-209, (2008).
Resta, R. and Vanderbilt, D., "Theory of Polarization: A Modern Approach." Springer-Verlag: p. 31-6868, (2008).
Standley, B.; Bao, W. Z.; Zhang, H.; Bruck, J.; Lau, C. N. and Bockrath, M., "Graphene-Based Atomic-Scale Switches." Nano Lett., 8, pp. 3345-3349, (2008).
Li, X.; Wang, X.; Zhang, L.; Lee, S. and Dai, H., "Chemically Derived, Ultrasmooth Graphene Nanoribbon Semiconductors." Science, 319, pp. 1229-1232, (2008).
Qin, Y.; Wang, X. and Wang, Z. L., "Microfibre-Nanowire Hybrid Structure for Energy Scavenging." Nature, 451, pp. 809-813, (2008).
Zhang, Y.; Tang, T.-T.; Girit, C.; Hao, Z.; Martin, M. C.; Zettl, A.; Crommie, M. F.; Shen, Y. R. and Wang, F., "Direct Observation of a Widely Tunable Bandgap in Bilayer Graphene." Nature, 459, pp. 820-823, (2009).
Pereira, V. M. and Neto, A. H. C., "Strain Engineering of Graphene's Electronic Structure." Phys. Rev. Lett. 2009,103, 046801, (2009).
Pereira, V. M.; Neto, A. H. C. and Peres, N. M. R., "Tight-binding Approach to Uniaxial Strain in Graphene." Phys. Rev. B 2009, 80, 045401, (2009).
Boukhvalov, D. W. and Katsnelson, M. I., "Chemical Functionalization of Graphene." J. Phys.-Condes. Matter, 21 (34), (2009).
Mohiuddin, T. M. G.; Lombardo, A.; Nair, R. R.; Bonetti, A.; Savini, G.; Jalil, R.; Bonini, N.; Basko, D. M.; Galiotis, C.; Marzari, N.; Novoselov, K. S.; Geim, A. K. and Ferrari, A. C., "Uniaxial Strain in Graphene by Raman Spectroscopy: G Peak Splitting, Gruneisen Parameters, and Sample Orientation." Phys. Rev. B 2009, 79, 205433, (2009).
Kim, K. S.; Zhao, Y.; Jang, H.; Lee, S. Y.; Kim, J. M.; Kim, K. S.; Ahn, J.-H.; Kim, P.; Choi, J.-Y. and Hong, B. H., "Large-Scale Pattern Growth of Graphene Films for Stretchable Transparent Electrodes." Nature 2009, 457, pp. 706-710, (2009).
Teague, M. L.; Lai, A. P.; Velasco, J.; Hughes, C. R.; Beyer, A. D.; Bockrath, M. W.; Lau, C. N. and Yeh, N. C., "Evidence for Strain-Induced Local Conductance Modulations in Single-Layer Graphene on SiO2." Nano Lett. 2009, 9, pp. 2542-2546, (2009).
Elias, D. C.; Nair, R. R.; Mohiuddin, T. M. G.; Morozov, S. V.; Blake, P.; Halsall, M. P.; Ferrari, A. C.; Boukhvalov, D. W.; Katsnelson, M. I.; Geim, A. K. and Novoselov, K. S., "Control of Graphene's Properties by Reversible Hydrogenation: Evidence for Graphane." Science 2009, 323, pp. 610-613, (2009).
Giannozzi, P.; Baroni, S.; Bonini, N.; Calandra, M.; Car, R.; Cavazzoni, C.; Ceresoli, D.; Chiarotti, G. L.; Cococcioni, M.; Dabo, I., et al., "Quantum Espresso: A Modular and Opensource Software Project for Quantum Simulations of Materials." J. Phys.-Condens. Matter 2009, 21, 395502, (2009).
Xia, F.; Mueller, T.; Lin, Y.; Valdes-Garcia, A. and Avouris, P., "Ultrafast Graphene Photodetector." Nat. Nanotechnol., 4 (12), pp. 839-843, (2009).
Chen, C.Y.; Rosenblatt, S.; Bolotin, K. I.; Kalb, W.; Kim, P.; Kymissis, I.; Stormer, H. L.; Heinz, T. F. and Hone, J., "Performance of

(56) References Cited

OTHER PUBLICATIONS

Monolayer Graphene Nanomechanical Resonators with Electrical Readout." Nat. Nanotechnol., 4 (12), pp. 861-867, (2009).
Fogler, M. M.; Castro Neto, A. H. and Guinea, F., "Effect of External Conditions on the Structure of Scrolled Graphene Edges." Phys. Rev. B 2010, 81, 161408, (2010).
Fujita, T.; Jalil, M. B. A. and Tan, S. G., "Valley Filter in Strain Engineered Graphene." Appl. Phys. Lett. 2010, 97, 043508, (2010).
Guinea, F.; Katsnelson, M. I. and Geim, A. K., "Energy Gaps and a Zero-Field Quantum Hall Effect in Graphene by Strain Engineering." Nat. Phys. 2010, vol. 6, pp. 30-33, (2010).
Park, S.; An, J.; Suk, J. W. and Ruoff, R. S., "Graphene-Based Actuators." Small 2010, 6, pp. 210-212, (2010).
Levy, N.; Burke, S. A.; Meaker, K. L.; Panlasigui, M.; Zettl, A.; Guinea, F.; Neto, A. H. C. and Crommie, M. F., "Strain-Induced Pseudo-magnetic Fields Greater Than 300 T in Graphene Nanobubbles." Science, vol., 329, pp. 544-547, (2010).
Nair, R. R.; Ren, W. C.; Jalil, R.; Riaz, I.; Kravets, V. G.; Britnell, L.; Blake, P.; Schedin, F.; Mayorov, A. S.; Yuan, S. J.; et al., "Fluorographene: A Two-Dimensional Counterpart of Teflon." Small 2010, 6, pp. 2877-2884, (2010).
Balog, R.; Jorgensen, B.; Nilsson, L.; Andersen, M.; Rienks, E.; Bianchi, M.; Fanetti, M.; Laegsgaard, E.; Baraldi, A.; Lizzit, S.; et al., "Band Gap Opening in Graphene Induced by Patterned Hydrogen Adsorption." Nat. Mater. 2010, 9, pp. 315-319, (2010).
Klintenberg, M.; Lebegue, S.; Katsnelson, M. I. and Eriksson, O., "A Theoretical Analysis of the Chemical Bonding and Electronic Structure of Graphene Interacting with Group IA and Group VIIA Elements." Phys. Rev. B 2010, 81, 085433, (2010).
Lee, C.; Yan, H.; Brus, L. E.; Heinz, T. F.; Hone, J. and Ryu, S., "Anomalous Lattice Vibrations of Single- and Few-Layer MoS2." ACS Nano 2010, 4, pp. 2695-2700, (2010).
Virojanadara, C.; Watcharinyanon, S.; Zakharov, A. A. and Johansson, L. I., "Epitaxial Graphene on 6H-SiC and Li Intercalation." Phys. Rev. B 2010, 82, 205402, (2010).
Leenaerts, O.; Peelaers, H.; Hernandez-Nieves, A. D.; Partoens, B. and Peeters, F. M., "First-principles Investigation of Graphene Fluoride and Graphene." Phys. Rev. B 2010, 82 (19), (2010).
Robinson, J. T.; Burgess, J. S.; Junkermeier, C. E.; Badescu, S. C.; Reinecke, T. L.; Perkins, F. K.; Zalalutdniov, M. K.; Baldwin, J. W.; Culbertson, J. C.; Sheehan, P. E. and Snow, E. S., "Properties of Fluorinated Graphene Films." Nano Lett. 2010, 10, pp. 3001-3005, (2010).
Mak, K.; Lee, C.; Hone, J.; Shan, J. and Heinz, T., "Atomically Thin MoS2: A New Direct-Gap Semiconductor." Phys. Rev. Lett. 2010, 105, (2010).
Agrawal, R. and Espinosa, H. D., "Giant Piezoelectric Size Effects in Zinc Oxide and Gallium Nitride Nanowires. A First Principles Investigation." Nano Lett. 2011, 11, pp. 786-790, (2011).
Coleman, J. N.; Lotya, M.; O'Neill, A.; Bergin, S. D.; King, P. J.; Khan, U.; Young, K.; Gaucher, A.; De, S.; Smith, R. J.; et al., "Two-Dimensional Nanosheets Produced by Liquid Exfoliation of Layered Materials." Science 2011, 331, pp. 568-571, (2011).
Singh, R. and Bester, G., "Hydrofluorinated Graphene: Two-dimensional Analog of Polyvinylidene Fluoride." Phys. Rev., B, 84 (15), (2011).
Yang, Q.; Wang, W.; Xu, S. and Wang, Z. L., "Enhancing Light Emission of ZnO Microwire-Based Diodes by Piezo-Phototronic Effect." Nano Lett. 2011, 11, pp. 4012-4017, (2011).
Shi, Z. W.; Lu, H. L.; Zhang, L. C.; Yang, R.; Wang, Y.; Liu, D. H.; Guo, H. M.; Shi, D. X; Gao, H. J.; Wang, E. G. andZhang, G., "Studies of Graphene-Based Nanoelectromechanical Switches." Nano Res., 5 (2), pp. 82-87, (2012).
Chandratre, S. and Sharma, P., "Coaxing graphene to be piezoelectric." Appl. Phys. Lett., 100 (2), (2012).
Lee, W. H.; Suk, J. W.; Chou, H.; Lee, J. H.; Hao, Y. F.; Wu, Y. P.; Piner, R.; Aldnwande, D.; Kim, K. S. and Ruoff, R. S., "Selective-Area Fluorination of Graphene with Fluoropolymer and Laser Irradiation." Nano Lett., 12 (5), pp. 2374-2378, (2012).
Fang, H.; Chuang, S.; Chang, T. C.; Takei, K.; Takahashi, T. and Javey, A., "High-Performance Single Layered WSe2 p-FETs with Chemically Doped Contacts". Nano Lett., 12, pp. 3788-3792, (2012).
Opium—pseudopotential generation project at http://opium.sourceforge.net.

* cited by examiner

US 9,246,078 B2

PIEZOELECTRIC APPARATUSES, SYSTEMS AND METHODS THEREFOR

RELATED PATENT DOCUMENT

This patent document claims benefit of U.S. Provisional Application Ser. No. 61/605,656 filed on Mar. 1, 2012; this provisional patent document and its accompanying Appendix are fully incorporated herein by reference.

FEDERALLY-SPONSORED RESEARCH AND DEVELOPMENT

This invention was made with Government support under contract W911NF-07-2-0027 awarded by the U.S. Army Research Laboratory. The Government has certain rights in this invention.

FIELD

The aspects of the present disclosure relate to apparatuses, systems and methods involving piezoelectricity, and in manifesting piezoelectric characteristics.

BACKGROUND AND OVERVIEW

Advances in nanoscale fabrication are leading to remarkably innovative devices for electronics, photonics, energy harvesting, and other applications. Microelectromechanical systems (MEMS) are being extended to the nanoscale (NEMS) in the context of nanosized actuators, motors, robots, and locomotive devices.

A challenge with these technologies relates to dynamically controlling motion and deformation at the nanoscale level. Piezoelectric materials have been used for dynamical control of material deformation by the application of an external electromagnetic field, in a wide variety of applications from pressure sensors to acoustic transducers to high voltage generators. Piezoelectricity is traditionally thought to be an intrinsic property of a particular material phase, for example, wurtzite structure.

However, many piezoelectric materials are limited in application due to one or more of composition, size and relatively limited interactivity variation.

SUMMARY

Aspects of the present disclosure relate generally to piezoelectric apparatuses, systems and methods, as may address challenges including those discussed above.

In accordance with various embodiments, an apparatus includes a nanomaterial and structures coupled to the nanomaterial, with the structures and nanomaterial manifesting piezoelectric characteristics therein. In some embodiments, dopants or other structures are added to a non-piezoelectric nanomaterial such as graphene to manifest piezoelectric characteristics therein via the combination of materials. The dopants or other structures may also be of a non-piezoelectric material. The respective structures may be combined with the nanomaterial uniformly or with a location-based approach to respectively set uniform or site-specific piezoelectric characteristics.

A variety of apparatuses can be implemented using manifested piezoelectricity as discussed herein. One embodiment is directed to a NEMS relay having a nanomaterial and structures coupled thereto that, together, manifest piezoelectric characteristics for operation of the relay. Another embodiment is directed to a pressure sensor having a nanomaterial and structures coupled thereto that manifest pressure-responsive piezoelectric characteristics. Another embodiment is directed to a cantilever-type structure including a nanomaterial and structures coupled thereto, with the nanomaterial and structures manifesting electromagnetic field-responsive piezoelectric characteristics.

Other embodiments are directed to manufacturing an apparatus by coupling structures to a nanomaterial and therein manifesting piezoelectric characteristics. This approach may be carried out to effect structures as above, such as by uniformly doping a nanomaterial to manifest generally uniform piezoelectric characteristics, or by doping different regions of a nanomaterial with different concentrations of dopants and/or different types of dopants to manifest varying piezoelectric characteristics that are different in different regions of the nanomaterial.

Another example embodiment is directed to a method of using an apparatus having a nanomaterial and structures that are coupled to and configured and arranged with the nanomaterial to manifest piezoelectric characteristics. Interaction with the nanomaterial, such as a pressure interaction or electric interaction, is effected to manifest a piezoelectric response in the nanomaterial. This approach may be implemented, for example, to cause a deflection of the nanomaterial and/or to effect an electrical characteristic in the nanomaterial.

In another example embodiment, an apparatus having a nanomaterial and structures that are coupled to and configured and arranged with the nanomaterial is used to induce piezoelectric characteristics. Specifically, the structures are used to strain the nanomaterial and therein manifest piezoelectric characteristics. For instance, atoms can be adsorbed and patterned to engineer strain in the nanomaterial. This strain can be used to set and/or alter characteristics such as those relating to electronic, optical and chemical properties.

Other embodiments are directed to a method in which a nanomaterial is provided, and piezoelectric characteristics are manifested in the nanomaterial via structures coupled to the nanomaterial and causation of interaction of the structures with the nanomaterial.

In another embodiment, an apparatus includes a piezoelectric material having a monolayer of nanomaterial with strain-induced piezoelectric characteristics, and a circuit structure including the piezoelectric material and respective circuit nodes coupled via the piezoelectric material. The piezoelectric material passes current between the circuit nodes in response to a bias applied to the piezoelectric material, via the strain-induced piezoelectric characteristics.

The above summary is not intended to describe each embodiment or every implementation of the present disclosure. The figures, detailed description and claims that follow more particularly exemplify various embodiments.

BRIEF DESCRIPTION OF THE DRAWINGS

Aspects of the present disclosure may be more completely understood in consideration of the detailed description of various embodiments of the present disclosure that follows in connection with the accompanying drawings, in which.

Figure 1:
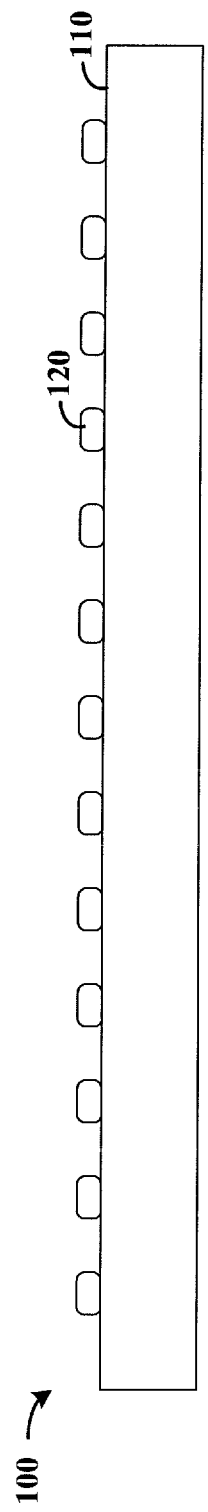
FIG. 1 shows a nanomaterial with structures coupled thereto in a generally uniform manner, and exhibiting manifested piezoelectric characteristics in accordance with an example embodiment of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DETAILED DESCRIPTION

The present disclosure relates to piezoelectric materials, apparatuses, systems and related methods, with various aspects directed to manifesting piezoelectric characteristics such as by combining (e.g., non-piezoelectric) materials to form a material exhibiting piezoelectric characteristics. While the present disclosure is not necessarily limited to such devices and applications, various aspects of the disclosure may be appreciated through a discussion of examples using these and other contexts.

In accordance with various embodiments, an apparatus includes a nanomaterial and structures coupled to the nanomaterial, with the structures and nanomaterial manifesting piezoelectric characteristics therein. In one embodiment, dopants or other structures such as atoms, molecules and other nanomaterials are added to a non-piezoelectric nanomaterial such as graphene to manifest piezoelectric characteristics therein via the combination of materials. Such manifestation may, for example, involve inducing in-plane and/or out-of-plane piezoelectricity. Various embodiments are also directed to the manipulation and dynamic control of the optical, chemical, electronic, and other properties of nanoscale devices. Such embodiments may be implemented as a method of using a device, or embodied in an apparatus that exhibits characteristics amenable to implementation for effecting such dynamic control (e.g., having adsorbants that interact with a nanomaterial to manifest piezoelectric characteristics for manifesting the control).

As described herein, manifesting piezoelectric characteristics involves a combination of materials that, when the materials are combined/interacting, exhibits piezoelectric properties. For instance, two materials having little or no intrinsic piezoelectric characteristics may be combined to form a structure that is piezoelectrically responsive. Such an approach may involve adding structures to a monolayer to strain the monolayer, which may be piezoelectrically responsive to mechanical deformation and/or an electromagnetic field (and in some instances, an electric field). Using such strain approaches, static piezoelectric characteristics can be imparted to the monolayer. Other approaches may involve combining materials in which one material exhibits at least some piezoelectric characteristics, with the combination and interaction exhibiting resulting piezoelectric characteristics that are different than either one of the materials.

Piezoelectric characteristics are manifested in one or more of a variety of manners, to suit different applications. In some embodiments, dopants or other structures are used to engineer uniform or site-specific piezoelectricity in the resulting combination of materials, to set piezoelectric characteristics of the nanomaterial and/or to form piezoelectric circuits therein. For instance, structures can be uniformly added to a nanomaterial in order to manifest generally uniform piezoelectric characteristics across the nanomaterial. Structures can also be added to specific regions, or with different concentrations in different regions, to induce region-specific or site-specific piezoelectric characteristics. In addition, different types of structures or dopants can be added in different regions of a monolayer, to manifest different piezoelectric characteristics in the different regions. The different regions or sites can be controlled independently from one another for manifesting piezoelectric characteristics therein. In certain embodiments, site-specific operation of a nanomaterial can be similarly effected with a uniformly-doped sheet, by applying an electromagnetic field to specific sites in the nanomaterial.

One or more mechanisms can be used to manifest piezoelectric characteristics, and can be implemented to suit particular applications, available materials or manufacturing conditions. For example, certain embodiments are directed to manifesting piezoelectric characteristics by using dopants or other structures to induce strain in a nanomaterial. The strained regions are rendered piezoelectrically responsive, and may render or otherwise set one or more characteristics such as those relating to one or more of electronic, optical and chemical properties.

In connection with various example embodiments, it has been discovered that piezoelectric effects can be engineered into non-piezoelectric graphene through the selective surface adsorption or doping of atoms. In some implementations, a single sheet of graphene is doped with atoms (e.g., on one side) to generate piezoelectricity by breaking inversion symmetry in the graphene. Piezoelectric magnitudes can be achieved with a two-dimensional sheet (e.g., a monolayer) in a manner that is comparable to magnitudes achieved in three-dimensional piezoelectric materials. Such three-dimensional materials may include, for example, bilayer materials or materials having a few layers. Using these approaches, designer piezoelectric characteristics are manifested in nanoscale materials, and can be used to dynamically control nanoscale electromechanical devices.

As may be related to the above, various example embodiments are directed to the patterned adsorption of atoms in a nanomaterial sheet to selectively control which spatial regions on the sheet are endowed with piezoelectricity. One embodiment is directed to one-sided doping of graphene and spatial control of adatom distribution. Such chemical doping of graphene with adatoms may include, for example, using one-sided hydrogen and/or fluorine covering of graphene. Another embodiment is directed to two-sided graphene doping, with different structures on each side being configured and arranged to break inversion symmetry in the graphene.

Other embodiments are directed to coadsorption of both hydrogen and fluorine, which can be used to obtain an $e_{11}$ type of piezoelectric response. In connection with various embodiments, it has been discovered that the $e_{11}$ type of piezoelectric response can be engineered into monolayer graphene. In some embodiments, this engineered piezoelectric effect is used for monolithic integration of electronic and electromechanical devices in graphene monolayers for resonators, sensors, and NEMS. One or more implementations are directed to a structure having hydrogen and fluorine as structures adsorbed on alternating carbon sites of a nanomaterial to manifest piezoelectricity. Such implementations may be effected with a change in point group symmetry from hexagonal 6/mmm to trigonal 3 m, removing an inversion center and introducing piezoelectricity (e.g., in grapheme), using a formation energy is defined, e.g., as:

$$E_f = \frac{1}{N_{atoms}}\left(E_d - E_g - \frac{N_H}{2}E_{H_2} - \frac{N_F}{2}E_{F_2}\right).$$

As may be implemented with such approaches, configurations for $C_2HF$ and $C_4HF$ can be used with a nanomaterial, with all carbon sites being occupied with alternating hydrogen atoms above the surface and fluorine atoms below the surface. This configuration may be obtained, for example, using an annealing process to reduce/minimize the number of grains in the sample and maximize the piezoelectric effect. Such configurations that exhibit in-plane ($e_{11}$) piezoelectricity can be implemented, with both a non-zero $e_{11}$ and $e_{31}$ piezoelectric effect. Such configurations can be used with nanoelectromechanical devices such as FETs, relays and sensors, which utilize this engineered piezoelectric effect in graphene to dynamically control mechanical motion at the nanoscale level. In some embodiments, such piezoelectric devices are monolithically integrated with other electronic devices on a single piece of graphene by controlling the spatial regions that are chemically modified and endowed with piezoelectricity. For general information regarding piezoelectric structures, and for specific information regarding such structures as may be implemented in accordance with one or more example embodiments herein, reference may be made to Ong, et al., "The Effect of Hydrogen and Fluorine Coadsorption on the Piezoelectric Properties of Graphene," *J. Phys. Chem*, Jan. 18, 2013, which is fully incorporated herein by reference.

Still other embodiments are directed to approaches as described herein using nanomaterials with some intrinsic piezoelectricity. For example, coupling adatoms or other materials to such nanomaterials, and/or straining such nanomaterials, can be effected to induce or set other piezoelectric characteristics. In connection with various embodiments, it has been discovered that materials such as thin sheet metals, and two-dimensional monolayer transition metal dichalcogenide (TMDC) nanoscale materials are piezoelectric, unlike their bulk parent crystals. Further, these materials can be tuned with piezoelectric characteristics in accordance with one or more approaches discussed herein, and can be used with nanoelectromechanical systems and piezotronics. For general information regarding piezoelectricity, and for specific information regarding such nanomaterials and to such nanomaterials having strain-induced piezoelectric characteristics as may be implemented with one or more embodiments (e.g., as strain-gauge type devices), reference may be made to Duerloo, et al., "Intrinsic Piezoelectricity in Two-Dimensional Materials, *J. Phys. Chem. Lett.*, pp. 2871-2876 (2012) (e.g., as indicated in Table 1 therein), which is fully incorporated herein by reference.

Other example embodiments are directed to a method of using an apparatus having a nanomaterial and structures coupled to the nanomaterial in order to manifest piezoelectric characteristics. In one embodiment, an electromagnetic field is applied to the nanomaterial-coupled structures to manifest piezoelectric characteristics in regions (e.g., portions) of the nanomaterial at which the structures are coupled and/or at which the field is applied. The field may, for example, be dynamically applied to modify the manifested piezoelectric characteristics (e.g., to control piezoelectric deflection and/or piezoelectric electrical characteristics). Certain embodiments involve applying strain to a material via structure-nanomaterial combinations as discussed herein, such as by applying static strain in the formation of the combination or by applying dynamic strain via the application of an electromagnetic field.

Other embodiments are directed to manufacturing an apparatus with manifested piezoelectric characteristics. Structures are coupled to a nanomaterial to manifest the piezoelectric characteristics, such as by coupling non-piezoelectric structures to a non-piezoelectric nanomaterial to form a piezoelectric structure-nanomaterial combination. Certain approaches involve patterning atoms on a surface of a nanomaterial to manifest piezoelectric characteristics at the patterned portions of the nanomaterial.

A variety of different materials are used in connection with various example embodiments. Example nanomaterials (e.g., as two-dimensional sheets) that can be used include Graphene, Boron Nitride (2D-hBN), Cobalt Oxide ($CoO_2^-$) Molybdenum disulfide ($MoS_2$), Manganese Oxide ($MnO_2$), Niobium diselenide ($NbSe_2$), $Bi_2Sr_2CaCu_2O_x$, $Bi_2SrTa_2O_9$ Tungsten disulfide ($WS_2$), Bismuth telluride ($Bi_2Te_3$), Molybdenum ditelluride ($MoTe_2$), Molybdenum diselenide ($MoSe_2$), Tantalum diselendie ($TaSe_2$) and Nickel ditelluride ($NiTe_2$). For general information regarding two-dimensional materials, and for more specific information regarding two-dimensional materials that may be implemented in connection with one or more example embodiments, reference may be made to Novoselov et al., Two-Dimensional Atomic Crystals, PNAS, 102, 10451 (2005), and to Coleman et al., Two-Dimensional Nanosheets Produced by Liquid Exfoliation of Layered Materials, *Science*, 331, 568 (2011), both of which are fully incorporated herein by reference.

Various other embodiments may be implemented in connection with Appendix A which was filed in the underlying provisional application, and the related publication entitled "Engineered Piezoelectricity in Graphene," ACS Nano January 2012, each of which is fully incorporated herein by reference. For instance, the various materials and structures as shown in and described in the Appendix can be implemented in one or more apparatuses, devices, systems and methods as described herein. In addition, the various graphical representations of piezoelectric and other characteristics as shown in the Appendix may be manifested in connection with various embodiments.

Turning now to the figures, FIGS. 1-3B show various apparatuses having a nanomaterial and structures coupled thereto, which manifest piezoelectric characteristics in accordance with various example embodiments. These apparatuses are exemplary of various approaches to adsorbing, doping or otherwise combining structures with a nanomaterial for the manifestation of the piezoelectric characteristics. Accordingly, a variety of different types of structures can be combined with a variety of different nanomaterials, in different manners and in different locations. Moreover, as exemplified in FIGS. 3A and 3B, the approaches herein are amenable to implementation with monolayers of material as well as with other materials, such as two or more monolayers, laminated materials and others.

Beginning with FIG. 1, an apparatus 100 includes a nanomaterial 110 with structures coupled thereto in a generally uniform manner. The structures, including structures 120 as labeled by way of example, are arranged on or at a surface of the nanomaterial 110 in a generally uniform manner. The apparatus 100 exhibits manifested piezoelectric characteristics, via the combination of the structures 120 with the nanomaterial.

Figure 2:
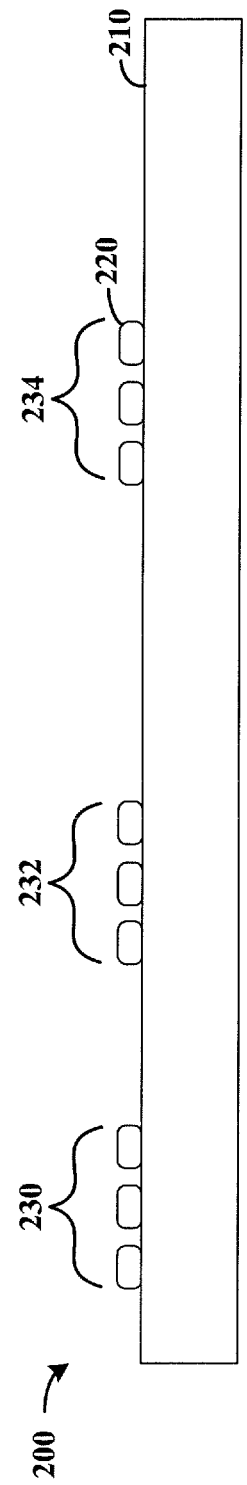
FIG. 2 shows a nanomaterial with structures coupled thereto in a region-specific manner, and exhibiting manifested piezoelectric characteristics in accordance with another example embodiment of the present disclosure.

Referring to FIG. 2, an apparatus 200 similarly includes a nanomaterial 210 with structures that exhibit region-specific piezoelectricity. The structures include structure 220 labeled by way of example, and are arranged in groups 230, 232 and 234 to manifest piezoelectric characteristics in respective regions of the nanomaterial 210 at which the groups are located. The groupings are shown by way of example, and may include similar densities of structures, or disparate densities of structures to effect differing degrees of piezoelectric characteristics.

Figure 3A:
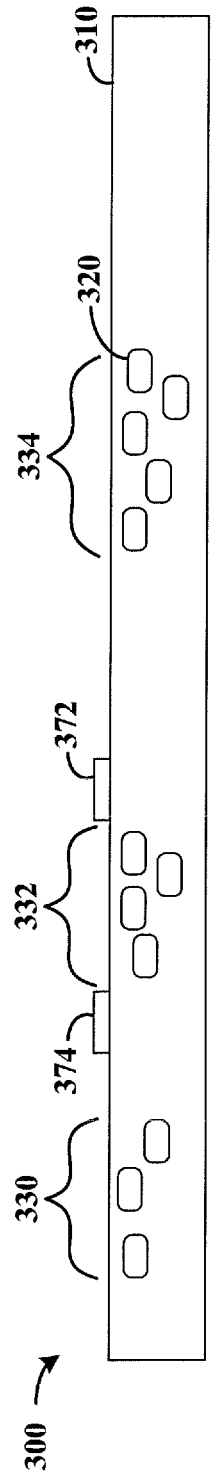
FIGS. 3A-3B show a nanomaterial with structures doped therein, the nanomaterial and structures manifesting piezoelectric characteristics in accordance with example embodiments of the present disclosure.
Figure 3B:
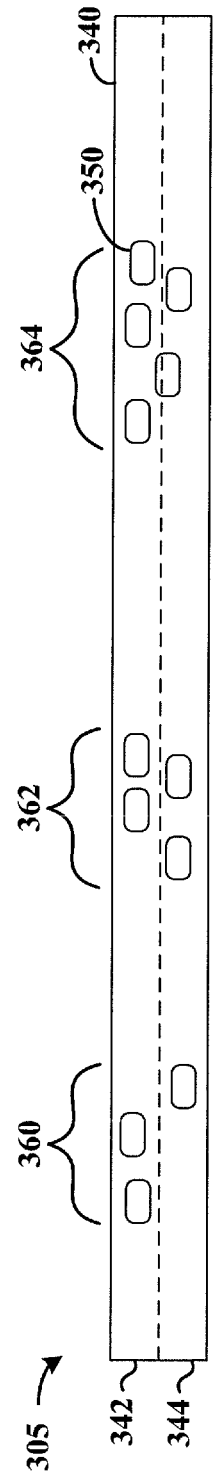

FIGS. 3A-3B show apparatuses 300 and 305 including nanomaterials having structures doped therein that manifest piezoelectric characteristics. In FIG. 3A, a nanomaterial 310 is doped with various dopants (320 labeled by way of example) in different regions 330, 332 and 334. In FIG. 3B, a nanomaterial 340, which may be implemented in layers 342 and 344 as represented by the dashed line, is also doped in different regions 360, 362 and 364, with similar or different dopants (350 labeled by way of example). Accordingly, the respective layers 342 and 344 in FIG. 3B may include a laminated layer or two layers arranged to effect certain piezoelectric reactions (e.g., as described in connection with FIGS. 6 and 7). By way of example, circuit nodes 372 and 374 are shown coupled via region 332, for detecting a current-based response of the region (such an approach may be implemented with some or all piezoelectric regions as shown in the figures). In some embodiments, the nanomaterial 340 is a three-dimensional material (e.g., greater than one atom thick), with dopants therein to manifest piezoelectric characteristics as described herein.

In some embodiments, one or both of the apparatuses 300 and 305 in FIGS. 3A-3B are apparatuses having strain-induced piezoelectric characteristics that are site specific, with the structures shown as dopants instead being implemented as strained regions of the nanomaterial 310 (e.g., where the nanomaterial is undoped). In this context, the nanomaterial 310 may also include an intrinsically piezoelectric material, with strain-induced piezoelectric characteristics at the respective regions shown as dopants (e.g., via an applied bias).

Figure 4:
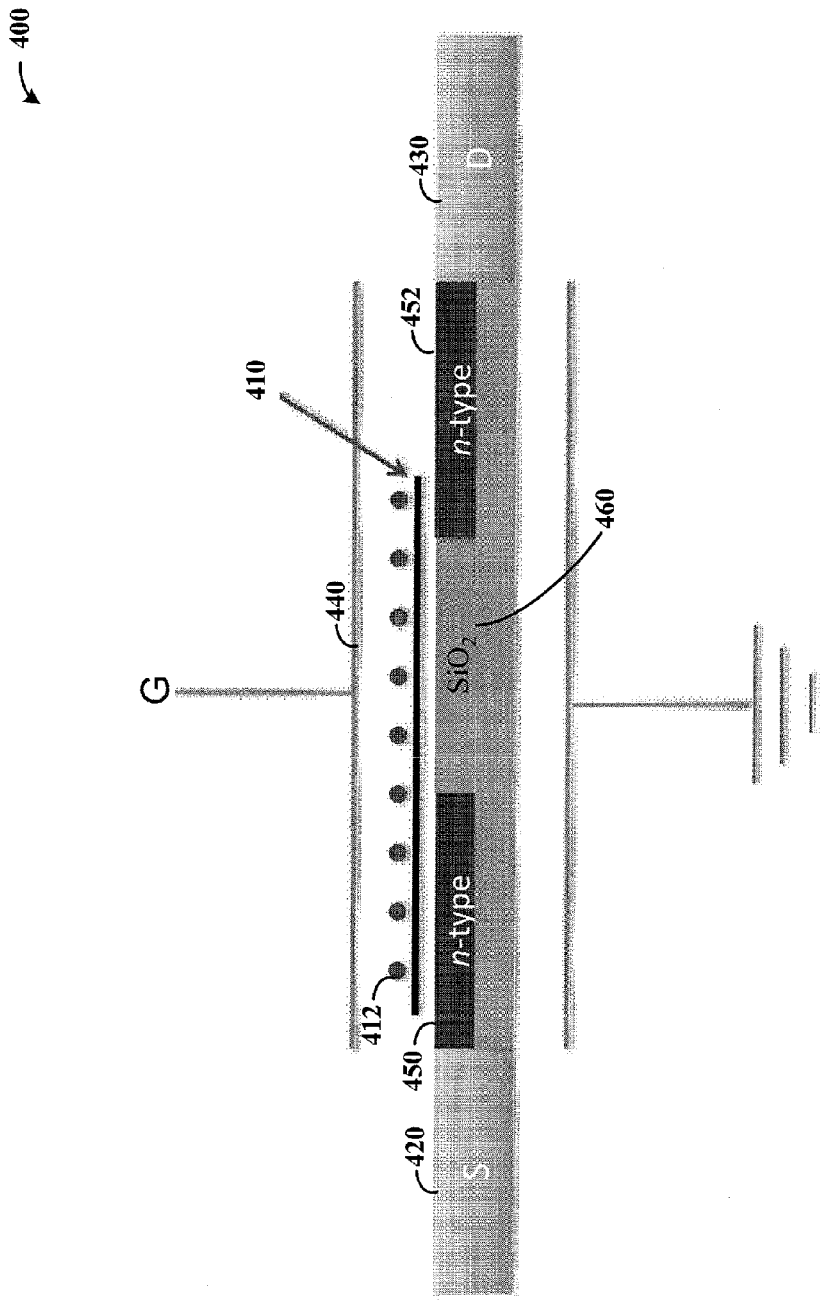
FIG. 4 shows a NEMS relay apparatus, in accordance with another example embodiment of the present invention.

FIG. 4 shows a NEMS relay apparatus 400, in accordance with another example embodiment of the present invention. The apparatus 400 includes a NEMS relay utilizing a graphene sheet 410 having structures 412 that manifest piezoelectric characteristics. The NEMS relay includes a source 420, drain 430 and gate 440, with a channel region between the source and drain including n-type doped silicon dioxide (SiO$_2$) regions 450 and 452 separated by an undoped region 460 of SiO$_2$. The sheet 410 is above the silicon dioxide and is configured and arranged to contract in response to an externally applied field, causing an overlap with an insulating region and turning off current flow through the relay (e.g., by selectively coupling the n-type doped regions 450 and 452).

In one implementation, the NEMS relay apparatus 400 is operated as follows. A gate voltage is applied over the relay at the gate 440, which applies an external electromagnetic field to the sheet 410 and which is about perpendicular to the surface of the sheet (FIG. 4 being shown in cross-section). This applied field strains the graphene sheet in-plane, and can be applied such that the sheet contracts and no longer overlaps the n-type region 452, for switching current off. Correspondingly, the field can be removed and in response to which the sheet 410 expands again, connecting the n-doped regions 450 and 452 and switching the relay on. This type of dynamic control is effected via the manifestation of piezoelectric characteristics in the sheet 410, via the coupling of structures 412 thereto.

Figure 6:
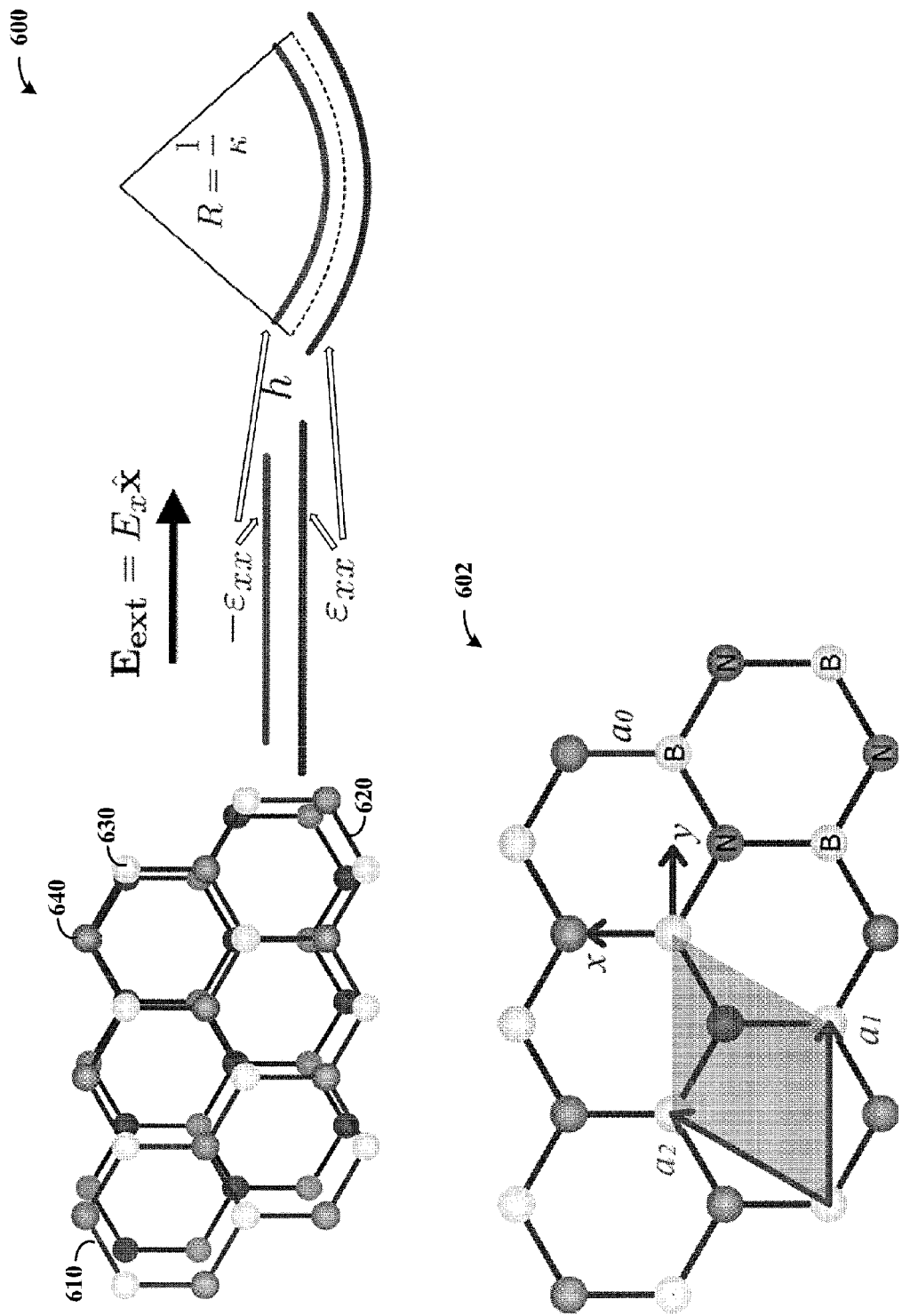
FIG. 6 shows a bilayer piezoelectric structure, in accordance with another example embodiment of the present invention.

In some embodiments, a plurality of NEMS relays as shown in FIG. 6 is implemented using a single sheet 410, with different regions of the sheet being manipulated via respective gates (440) to control the relay operation. In some implementations, different regions of the sheet are doped differently to effect relay operation at different threshold levels of voltage applied to create a field necessary to switch the relay.

Figure 5:
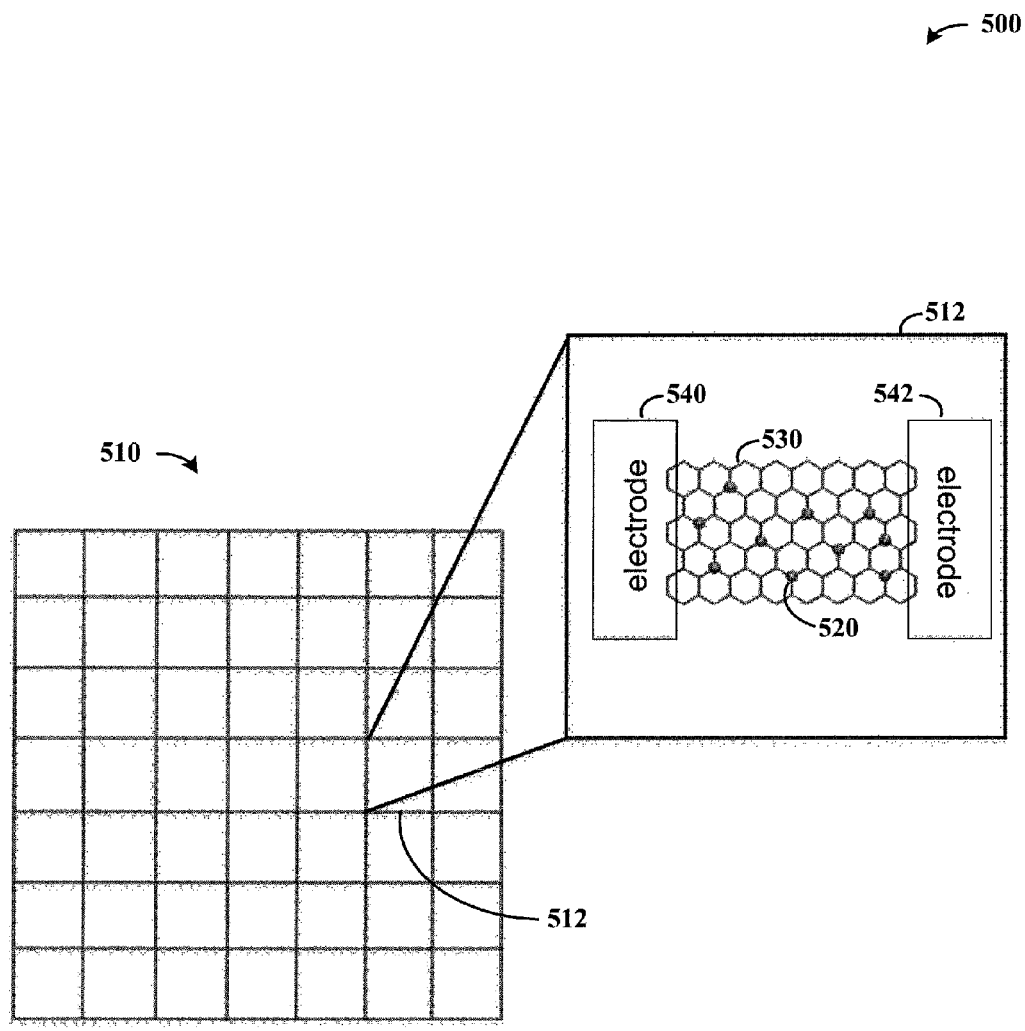
FIG. 5 shows a pressure sensor apparatus, in accordance with another example embodiment of the present invention.

FIG. 5 shows a pressure sensor apparatus 500, in accordance with another example embodiment of the present invention. The apparatus 500 includes an array 510 of pressure sensors, with one sensor shown in greater detail in inset 512. Each pressure sensor includes a sheet such as graphene or other two-dimensional material as referenced herein, and extending between electrodes 540 and 542. The sheet includes a plurality of structures/dopants 520 coupled to respective portions/molecules 530 within the sheet. The electrodes transfer an electrical signal to an external circuit when pressure is applied to the sheet, with the sheet being piezoelectrically responsive via the structure-molecule (520-530) interaction. The respective sensors in the array can be used, for example, to map out pressure patterns, or conversely, to generate pressure patterns.

A 2D piezoelectric material such as boron nitride or piezoelectric graphene can be used as a pressure sensor by connecting the sheet to two electrodes that transfer an electrical signal to an external circuit when pressure is applied to the system. Multiple units of this system can be arranged in a rectangular array where each unit feels a different pressure and hence transmits different electrical signals. This facilitates mapping of pressure gradients across the sensor.

In another example embodiment, an apparatus includes first and second monolayers of nanomaterial, the second monolayer being configured and arranged with the first monolayer to manifest strain characteristics via piezoelectric strain mismatch. In some implementations, the first and second monolayers include boron nitride and are oppositely aligned relative to one another. In such implementations, the first and second monolayers are responsive to an electromagnetic field by elongating in the first monolayer and contracting in the second monolayer in a direction determined by the applied electromagnetic field.

FIG. 6 shows a bilayer piezoelectric structure 600, in accordance with another example embodiment of the present invention. The structure 600 includes first and second monolayers 610 and 620 of boron nitride, respectively including alternating boron and nitrogen (630 and 640, labeled by way of example). Boron nitride exhibits a honeycomb structure, such as in graphene, and exhibits in-plane linear piezoelectricity (i.e., in-plane fields generate proportional in-plane strains) as its planar form lacks inversion symmetry. When an electromagnetic field is applied along an x (armchair) direction as shown in inset 602, a contraction or an elongation in the bilayer material is effected, depending on the relative orientations of the electromagnetic field and the relevant B->N axis. In some embodiments, two boron nitride sheets are oppositely aligned to form a bilayer that is responsive to an in-plane field along the x-direction by elongating in one sheet and contracting in the other sheet.

The boron nitride interlayer bonding is such that there is an energetic preference for the boron sites to be on top of the nitrogen sites and vice versa, as shown in FIG. 6. This arrangement is implemented such that the bilayer as a whole will bend slightly to accommodate piezoelectric strain mismatch while preserving the relative position of the two honeycomb structures. This can be used in a variety of applications, including cantilever applications as described in connection with FIG. 7 below.

Figure 7:
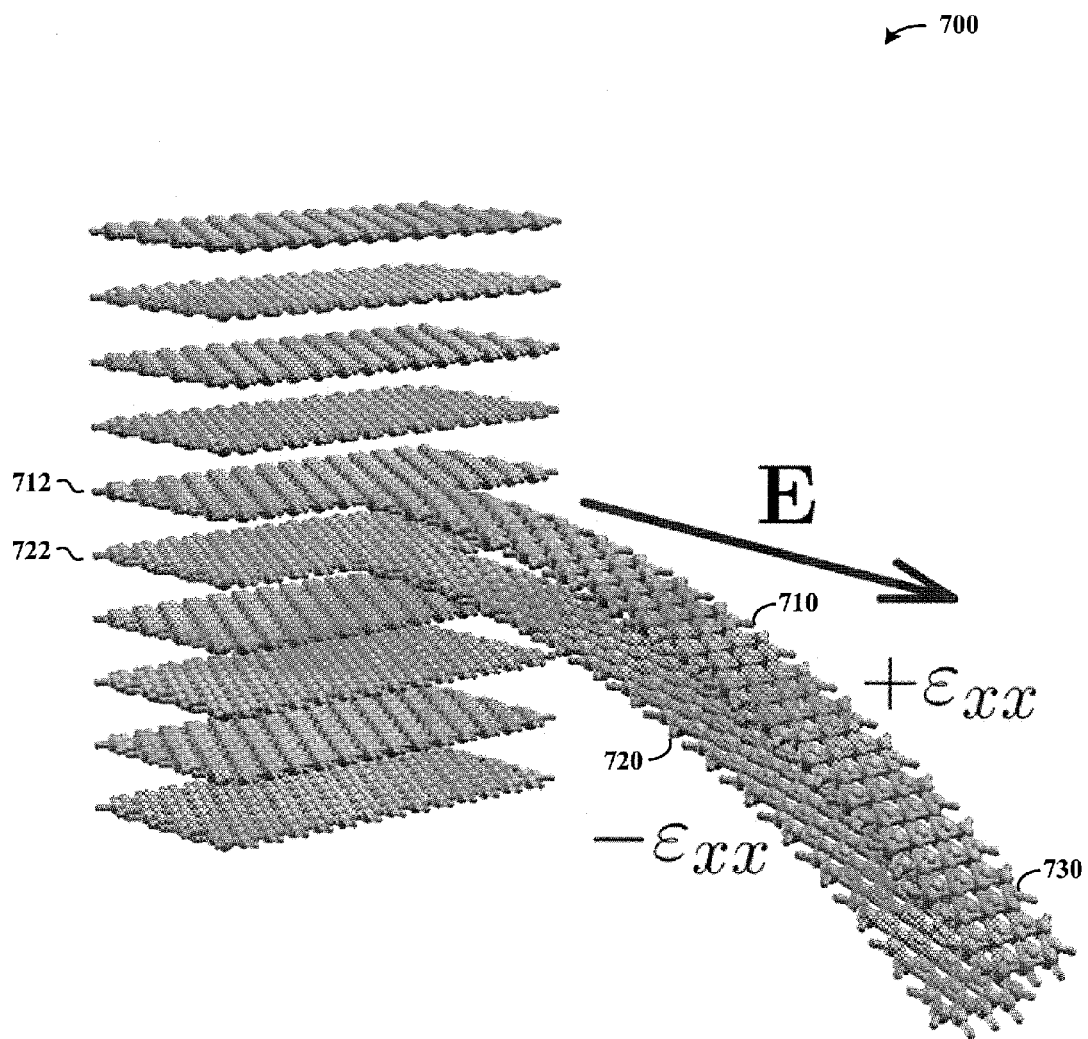
FIG. 7 shows a cantilever apparatus, in accordance with another example embodiment of the present invention.

FIG. 7 shows a cantilever apparatus 700, in accordance with another example embodiment of the present invention. The apparatus 700 includes a bilayer structure cantilever including layers 710 and 720, respectively anchored at 712 and 722. This bilayer structure may, for example, be implemented using a non-centrosymmetric material as shown in FIG. 6. The end 730 of the cantilever deflects as shown in response to an in-plane field, accommodating a mismatch in the piezoelectric equilibrium strain between the respective materials. Correspondingly, the layers 710 and 720 generate a piezoelectric response when the layers are moved as shown, facilitating the detection of such bending.

The position of the tip of the bilayer cantilever can be tuned with sub-Angstrom accuracy using an applied in-plane voltage. In some implementations, a molecule is attached to the tip area 730 and carefully manipulated or even deposited on a substrate. As the cantilever is largely insensitive to vertical fields, a vertical field pulse can be used to transfer molecules on and off of the tip, giving very high versatility in addition to fine control for bottom-up nanoscale applications.

In various embodiments, the respective layers 710 and 720 are made of non-piezoelectric materials such as graphene, with piezoelectric characteristics manifested therein via the addition of structures such as dopants and others described hereinabove.

In another example embodiment, a sound or ultrasound generator includes a bilayer piezoelectric structure as discussed herein. The generator includes a large rectangular array of bilayer columns on a substrate in a fluid medium, and the array is subdivided into pixels respectively having a set of electrodes supplying an alternating field. Using this approach, the amplitude, frequency and phase of the (ultra) sound generated by each pixel can be spatially controlled. This facilitates the engineering of sound fields to fit a specific purpose (e.g., killing tumor cells at a predetermined location using ultrasound from a 'sticker' with such a BN array attached to the body).

In another embodiment, a hydrocarbon vapor sensor includes a bilayer piezoelectric material. The bilayer structure deflects when molecules having sufficient momentum hit it, and this deflection is sensed. For example, heavy molecules in the air can include hydrocarbons from unwanted pipeline and engine leaks. Accordingly, the bilayer structure can be implemented as a sensor and used to detect such leaks, with the detected molecules being registered as a voltage pulse coming from the bilayer structure.

Another example embodiment involving a bilayer structure includes a molecular gate. A cantilever as shown in FIG. 7 is used to open or close an aperture through which small molecules pass. In some embodiments, the molecules passing through the aperture are counted as they bump into the cantilever. This facilitates fine control over impurity concentrations in a medium.

Figure 8:
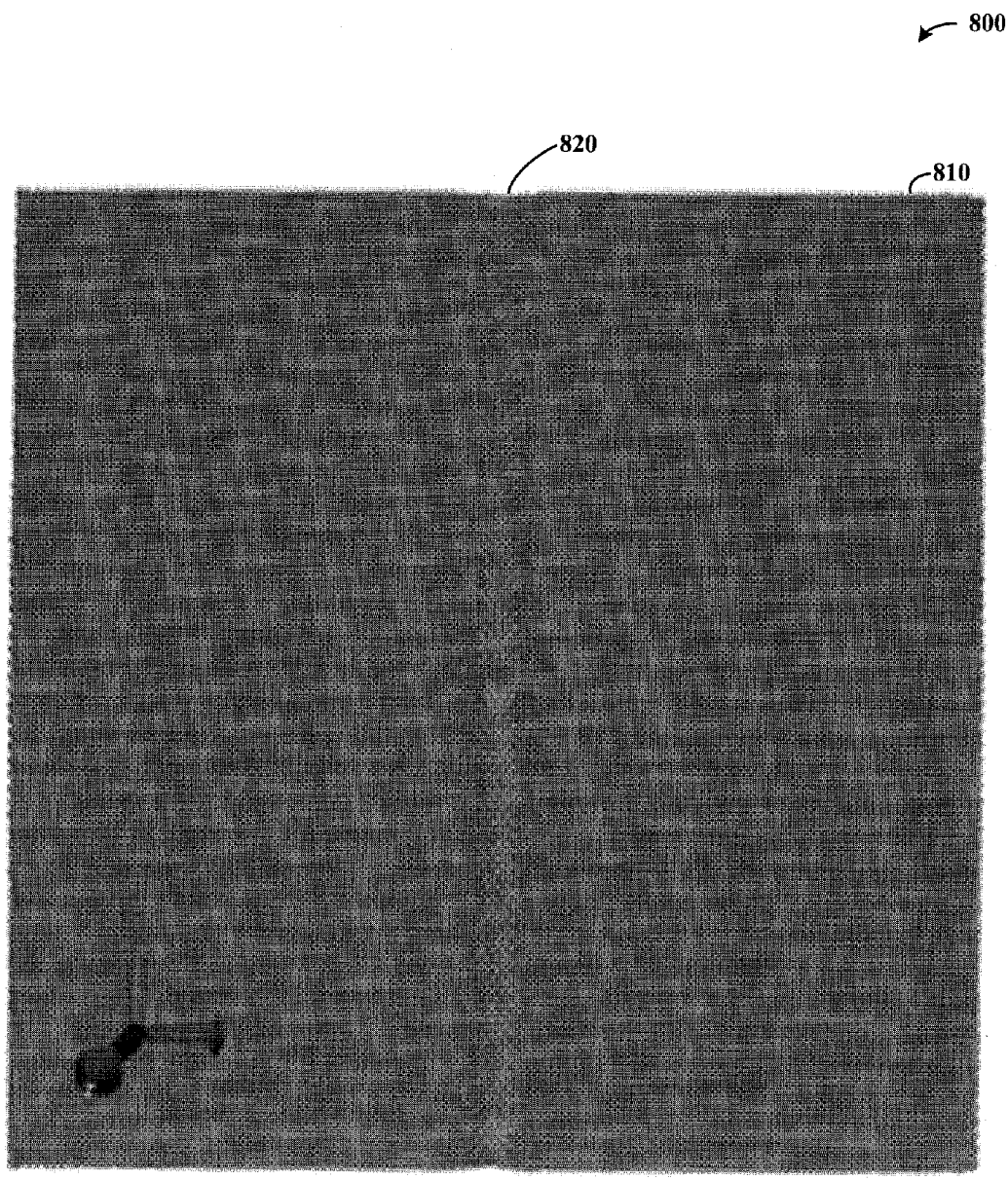
FIG. 8 shows a planar device having static strain set via adsorption and/or doping of atoms on a nanomaterial, in accordance with another example embodiment of the present invention.

Referring to FIG. 8, a planar device 800 is shown with static strain set (e.g., engineered) by selectively adsorbing or doping atoms on a graphene nanomaterial 810. Doped region 820 (e.g., doped with hydrogen) sets a specific strain pattern. Region-specific in-plane strain and out-of-plane ripples are achieved at the boundaries between doped and undoped regions of the graphene nanomaterial 810. Using this approach, one or more of electronic, optical and chemical properties of the graphene nanomaterial 810 can be set or manipulated, via the application of strain. For example, engineering strain in this manner can create channels, which can bias chemical reactivity for atoms or molecules on a surface of the graphene nanomaterial 810. In some embodiments, strain is set in the graphene nanomaterial 810 via atom deposition to change the Fermi energy and density of states around the Fermi energy, which affects the nanomaterial's ability to absorb light and thus, its optical properties.

Figure 9:
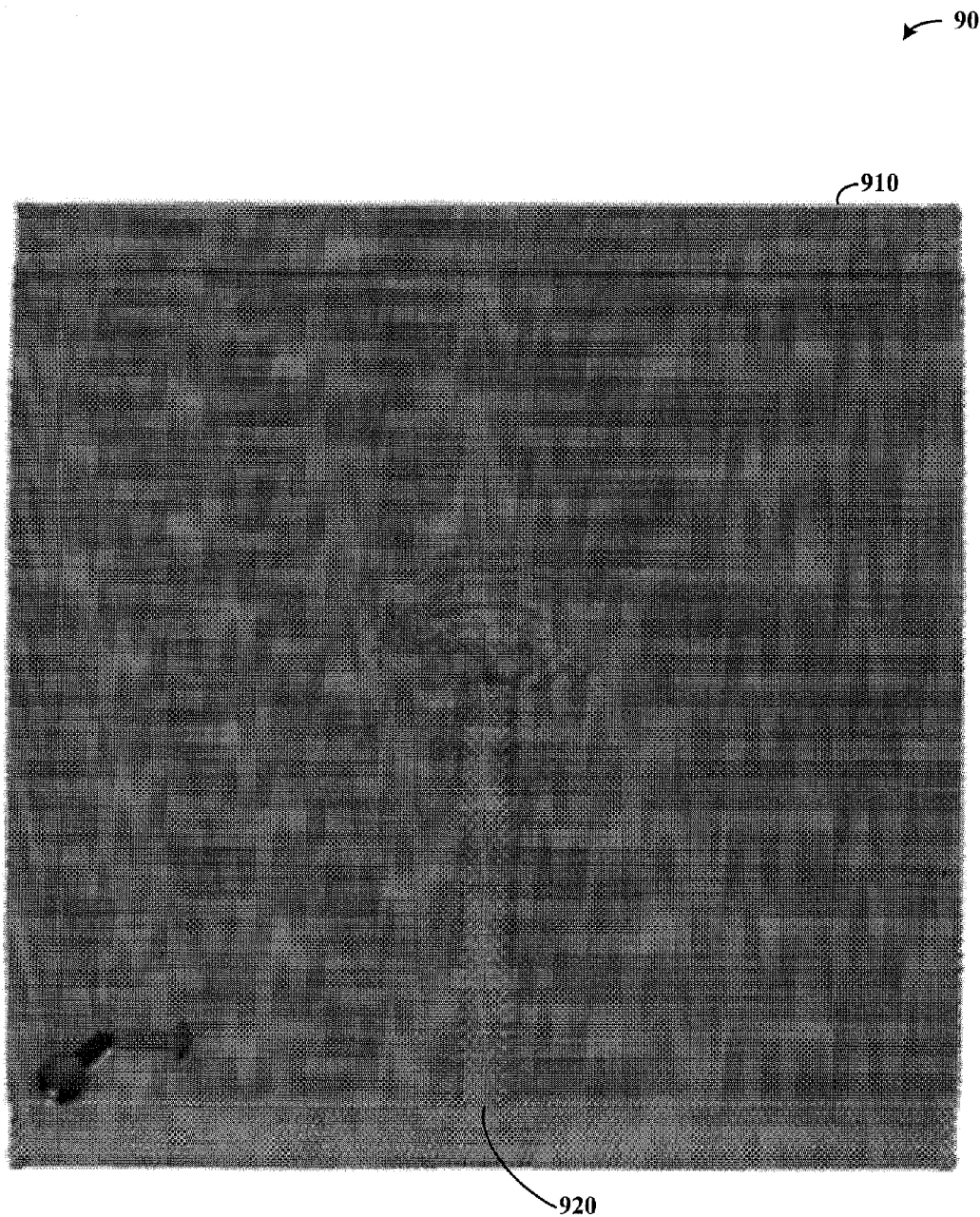
FIG. 9, shows a planar device having static strain set via adsorption and/or doping of atoms on a nanomaterial, in accordance with another example embodiment of the present invention.

FIG. 9 shows another planar device 900, also having strain set via adsorbing and/or doping of atoms upon a graphene nanomaterial 910. A portion 920 of the nanomaterial 910 is doped as shown, and configured to strain the nanomaterial, with ripples extending from an end region of the doped portion 920.

In some embodiments, dynamical changes in strain are achieved through a piezoelectric effect, using the dopants as shown in one or both of FIGS. 8 and 9. The piezoelectric properties manifested by several varieties of doped nanomaterials can be used for fast mechanical switching of optical properties. In one embodiment, slabs of nanomaterial are controlled by an electromagnetic field and therein moved in and out of an optical path, modulating the amplitude and phase of passing light waves. In another embodiment, several parallel non- or weakly interacting layers are used to develop a periodic Moiré pattern upon application of a field, thereby effectively creating a diffraction grating that can be used for various applications, such as for spectral operations upon an image. In addition, while the approaches shown in FIGS. 8 and 9 refer to graphene, various embodiments are directed to similar approaches using nanomaterials other than graphene.

Another embodiment is directed to optical sensing. A sheet of nanomaterial is rendered optically active by selective absorption of atoms on a very specific site on one side of the nanomaterial, and another side of the nanomaterial (e.g., an opposing side of a nanomaterial sheet) is piezoelectrically doped. The piezoelectric effect is configured and arranged to provide an optically active zone on the sheet that can be scanned very finely across a surface, and therein providing a near-field optical sensor.

While various aspects of the present invention are amenable to modifications and alternative forms, specifics thereof have been shown by way of example in the drawings and will be described in further detail. It should be understood that the intention is not to limit the invention and disclosure herein to the particular embodiments and/or applications described. On the contrary, the intention is to cover all modifications, equivalents, and alternatives falling within the spirit and scope of the invention.

What is claimed is:

1. An apparatus comprising:
    a nanomaterial; and
    structures coupled to the nanomaterial and configured and arranged with the nanomaterial to manifest piezoelectric characteristics via interaction between the structures and nanomaterial, wherein the structures are configured and arranged with the nanomaterial to manifest the piezoelectric characteristics in regions of the nanomaterial, via interaction between the structures and nanomaterial that alters an inversion symmetry characteristic of the nanomaterial.

2. The apparatus of claim 1,
wherein the structures include a plurality of structures configured and arranged with the nanomaterial to manifest the piezoelectric characteristics in different regions of the nanomaterial, via the interaction between the structures and nanomaterial that alters the inversion symmetry characteristic of the nanomaterial;
further including
   a first circuit including first circuit terminals electrically coupled via a first one of the different regions and configured and arranged to pass current between the terminals in response to a piezoelectric condition at the first one of the different regions;
   a second circuit including second circuit terminals electrically coupled via a second one of the different regions that is different than the first one of the different regions, the second circuit being configured and arranged to pass current between the terminals in response to a piezoelectric condition at the first one of the different regions; and
   a gate circuit configured and arranged to control current flow in the first and second circuits by selectively presenting the respective piezoelectric conditions at the first and second ones of the different regions.

3. The apparatus of claim 2, wherein
the first one of the different regions is configured and arranged with a first inversion symmetry characteristic via the interaction between the structures and nanomaterial at the first region; and
the second one of the different regions is configured and arranged with a second inversion symmetry characteristic via the interaction between the structures and nanomaterial at the second region, the second inversion symmetry characteristic being different than the first inversion symmetry characteristic.

4. The apparatus of claim 2, wherein
the first one of the different regions is configured and arranged with a first density of the structures, and
the second one of the different regions is configured and arranged with a second density of the structures, the first and second densities being respectively configured and arranged to manifest different piezoelectric characteristics in the first and second different regions.

5. The apparatus of claim 2, wherein the structures are dopants in the nanomaterial.

6. The apparatus of claim 2, wherein
the first one of the different regions is configured and arranged with a first type of the structures, and
the second one of the different regions is configured and arranged with a second type of the structures, the first and second types being respectively configured and arranged to manifest different piezoelectric characteristics in the first and second different regions.

7. The apparatus of claim 6, wherein the structures are dopants in the nanomaterial.

8. The apparatus of claim 2, wherein the structures are configured and arranged with the nanomaterial to manifest the piezoelectric characteristics by inducing stress in the nanomaterial, at the first and second regions, to alter an inversion symmetry characteristic of the nanomaterial.

9. The apparatus of claim 1, wherein the structures include first and second sets of structures respectively coupled to different portions of the nanomaterial, the first and second structures being configured and arranged to manifest the piezoelectric characteristics by altering an inversion symmetry characteristic of the nanomaterial.

10. The apparatus of claim 9, wherein the nanomaterial is a sheet and the first and second sets of structures are respectively coupled to different sides of the sheet.

11. The apparatus of claim 1, wherein the structures include first and second structures, the first structure being configured and arranged with the nanomaterial to manifest piezoelectric characteristics in a first portion of the nanomaterial, independently from piezoelectric characteristics manifested via the second structure in a second portion of the nanomaterial.

12. The apparatus of claim 1, wherein neither the structures nor the nanomaterial is intrinsically piezoelectric.

13. The apparatus of claim 1, wherein the structures are configured and arranged with the nanomaterial to dynamically manifest location-based piezoelectric characteristics in different locations in the apparatus, in response to a varied electromagnetic field.

14. The apparatus of claim 1, wherein the structures are non-uniformly dispersed in the nanomaterial and configured and arranged with the nanomaterial to effect location-based piezoelectric characteristics that are different at different regions of the nanomaterial.

15. The apparatus of claim 1, wherein the structures are configured and arranged with the nanomaterial to manifest location-based piezoelectric characteristics by straining the nanomaterial, via the interaction between the nanomaterial and the structures, at respective locations of the nanomaterial to which the structures are coupled.

16. The apparatus of claim 1, wherein
the nanomaterial is a first monolayer of nanomaterial, and
the structures include a second monolayer of nanomaterial material configured and arranged to manifest strain characteristics in the first monolayer via piezoelectric strain mismatch between the first and second monolayers, wherein the first and second monolayers are configured and arranged to oppositely align relative to one another such that, responsive to a stimuli selected from the group consisting of pressure, an electromagnetic field, and an electric field, one of the first and second monolayers is configured and arranged to elongate and the other of the first and second monolayers is configured and arranged to contract.

17. The apparatus of claim 1, wherein the structures include dopants of different concentrations in different regions of the nanomaterial, the different regions exhibiting different piezoelectric characteristics corresponding to the respective dopant concentrations in each of the different regions.

18. The apparatus of claim 1, wherein the structures include first and second types of dopants in different regions of the nanomaterial, the first type of dopant being configured and arranged with the nanomaterial to manifest a first piezoelectric characteristic, and the second type of dopant being configured and arranged with the nanomaterial to manifest a second piezoelectric characteristic that is different than the first piezoelectric characteristic.

19. A method comprising:
providing a nanomaterial;
manifesting piezoelectric characteristics in the nanomaterial by providing structures coupled to the nanomaterial and causing interaction of the structures with the nanomaterial; and
altering an inversion symmetry characteristic of the nanomaterial to manifest the piezoelectric characteristics in regions of the nanomaterial, via the interaction between the structures and nanomaterial.

20. An apparatus comprising:

a piezoelectric material including a monolayer of nanomaterial configured and arranged with strain-induced piezoelectric characteristics, the monolayer of nanomaterial being configured and arranged to manifest the strain-induced piezoelectric characteristics in regions of the monolayer of nanomaterial via interaction of the nanomaterial that alters an inversion symmetry characteristic of the monolayer of nanomaterial; and a circuit structure including the piezoelectric material and respective circuit nodes coupled via the piezoelectric material, the piezoelectric material being configured and arranged to, via the strain-induced piezoelectric characteristics, pass current between the circuit nodes in response to a bias applied to the piezoelectric material.

* * * * *